(12) United States Patent
Lee

(10) Patent No.: US 12,295,098 B2
(45) Date of Patent: May 6, 2025

(54) MULTILAYER BOARD AND MANUFACTURING METHOD THEREOF

(71) Applicant: AZOTEK CO., LTD., Taoyuan (TW)

(72) Inventor: Hung-Jung Lee, Taoyuan (TW)

(73) Assignee: AZOTEK CO., LTD., Taoyuan (TW)

( * ) Notice: Subject to any disclaimer, the term of this patent is extended or adjusted under 35 U.S.C. 154(b) by 0 days.

(21) Appl. No.: 18/736,562

(22) Filed: Jun. 7, 2024

(65) Prior Publication Data

US 2024/0324100 A1 Sep. 26, 2024

Related U.S. Application Data

(62) Division of application No. 18/053,365, filed on Nov. 7, 2022, now Pat. No. 12,058,811.

(Continued)

(30) Foreign Application Priority Data

Jun. 28, 2022 (TW) .................................. 111124134

(51) Int. Cl.
*H05K 1/03* (2006.01)
*B32B 7/027* (2019.01)
(Continued)

(52) U.S. Cl.
CPC ............ *H05K 1/032* (2013.01); *B32B 7/027* (2019.01); *B32B 15/09* (2013.01); *H05K 3/4626* (2013.01); *B32B 15/08* (2013.01); *B32B 15/20* (2013.01); *B32B 27/36* (2013.01); *B32B 37/04* (2013.01); *B32B 37/10* (2013.01); *B32B 37/144* (2013.01); *B32B 37/16* (2013.01); *B32B 2250/05* (2013.01); *B32B 2250/40* (2013.01); *B32B 2250/42* (2013.01); *B32B 2270/00* (2013.01); *B32B 2305/55* (2013.01); *B32B 2307/30* (2013.01); *B32B 2307/704* (2013.01); *B32B 2309/02* (2013.01); *B32B 2311/00* (2013.01); *B32B 2367/00* (2013.01); *B32B 2457/08* (2013.01);
(Continued)

(58) Field of Classification Search
None
See application file for complete search history.

(56) References Cited

U.S. PATENT DOCUMENTS

| | | |
|---|---|---|
| 5,248,530 A | 9/1993 | Jester et al. |
| 5,719,354 A | 2/1998 | Jester et al. |

(Continued)

FOREIGN PATENT DOCUMENTS

| | | | |
|---|---|---|---|
| CN | 112349683 A | | 2/2021 |
| CN | 112349685 A | * | 2/2021 |

(Continued)

*Primary Examiner* — Vivian Chen
(74) *Attorney, Agent, or Firm* — CKC & Partners Co., LLC

(57) ABSTRACT

A multilayer board includes laminates. Each of the laminates includes a liquid crystal polymer substrate and a metal layer. Each of the liquid crystal polymer substrates has a melting point. The number of the liquid crystal polymer substrates is an even number, they include first and second middle substrates that are located in the most middle position and respectively have first and second melting points that are substantially same. The first or second melting point is lowest among the melting points. The melting points increase in a direction away from the first and second middle substrates.

9 Claims, 7 Drawing Sheets

Related U.S. Application Data

(60) Provisional application No. 63/269,836, filed on Mar. 24, 2022.

(51) Int. Cl.

| | | |
|---|---|---|
| *B32B 15/08* | (2006.01) | |
| *B32B 15/09* | (2006.01) | |
| *B32B 15/20* | (2006.01) | |
| *B32B 27/36* | (2006.01) | |
| *B32B 37/04* | (2006.01) | |
| *B32B 37/10* | (2006.01) | |
| *B32B 37/14* | (2006.01) | |
| *B32B 37/16* | (2006.01) | |
| *H05K 3/46* | (2006.01) | |

(52) U.S. Cl.
CPC ........... *H05K 1/036* (2013.01); *H05K 3/4632* (2013.01); *H05K 2201/0129* (2013.01); *H05K 2201/0141* (2013.01)

(56) References Cited

U.S. PATENT DOCUMENTS

| | | | |
|---|---|---|---|
| 12,058,811 B2 * | 8/2024 | Lee | H05K 1/032 |
| 2002/0076538 A1 | 6/2002 | St. Lawrence et al. | |
| 2002/0079135 A1 * | 6/2002 | Yazaki | H05K 3/4069 |
| | | | 174/264 |
| 2002/0086145 A1 * | 7/2002 | Yazaki | H05K 3/4617 |
| | | | 428/209 |
| 2004/0040651 A1 | 3/2004 | Tsugaru et al. | |
| 2006/0278963 A1 * | 12/2006 | Harada | H05K 3/4688 |
| | | | 257/668 |
| 2007/0267138 A1 | 11/2007 | White et al. | |
| 2014/0071639 A1 * | 3/2014 | Honjo | H05K 3/4069 |
| | | | 174/254 |
| 2014/0231123 A1 * | 8/2014 | Onodera | C08J 5/18 |
| | | | 174/255 |
| 2016/0212845 A1 * | 7/2016 | Nakashima | H05K 1/0326 |
| 2017/0238428 A1 * | 8/2017 | Takahashi | H05K 1/0393 |
| | | | 174/251 |
| 2018/0235072 A1 | 8/2018 | Lee | |
| 2018/0235083 A1 | 8/2018 | Lee et al. | |
| 2019/0080817 A1 * | 3/2019 | Ohata | H01B 3/307 |
| 2019/0240957 A1 | 8/2019 | Lee | |
| 2019/0345308 A1 | 11/2019 | Lee | |
| 2020/0157297 A1 | 5/2020 | Wang | |
| 2020/0196444 A1 * | 6/2020 | Jin | H05K 1/113 |
| 2020/0325293 A1 * | 10/2020 | Lee | C08J 7/08 |
| 2022/0063247 A1 | 3/2022 | Lee | |
| 2022/0087034 A1 | 3/2022 | Lee et al. | |
| 2022/0251315 A1 | 8/2022 | Wang | |

FOREIGN PATENT DOCUMENTS

| | | |
|---|---|---|
| JP | 2001-244630 A | 9/2001 |
| JP | 2006-344828 A | 12/2006 |
| JP | 2009-071021 A | 4/2009 |
| WO | 2007097366 A1 | 8/2007 |
| WO | 2015050080 A1 | 4/2015 |

* cited by examiner

MULTILAYER BOARD AND MANUFACTURING METHOD THEREOF

CROSS-REFERENCE TO RELATED APPLICATION

The present application is a Divisional Application of the U.S. application Ser. No. 18/053,365, filed Nov. 7, 2022, now U.S. Pat. No. 12,058,811, which claims priority to U.S. Provisional Application Ser. No. 63/269,836 filed Mar. 24, 2022, and Taiwan Application Serial Number 111124134, filed Jun. 28, 2022, the disclosures of which are incorporated herein by reference in their entireties.

BACKGROUND

Field of Invention

The present disclosure relates to a multilayer board and a manufacturing method thereof. More particularly, the present disclosure relates to a multilayer board including liquid crystal polymer substrates with different melting points and a manufacturing method thereof.

Description of Related Art

The clock rates of central processing units (CPU) used in current mobile devices, such as smartphones, tablets, and laptops, are mostly above gigahertz (GHz), so mobile devices need to use high-frequency circuits to meet the CPU requirements. In addition, in order to meet the needs of high-frequency circuits, manufacturers must reduce the adverse effects caused by resistive-capacitive delay (RC delay).

Liquid crystal polymers (LCPs) have excellent low moisture absorption, heat resistance, chemical resistance, and dielectric properties, and therefore are suitable as a substrate for high-frequency circuits or high-speed transmission circuits. The stack of multilayer boards contains multiple dielectric layers. When the stack is thermally pressed, the distances between the dielectric layers and the heat source are different, and therefore the dielectric layers are unevenly heated, resulting in the problem of poorly pressed multilayer boards. In view of the above, it is necessary to develop a new multilayer board to overcome the above problem.

SUMMARY

The present disclosure provides a multilayer board including a plurality of laminates (i.e., laminated plate or laminated panel) that are stacked from bottom to top. Each of the laminates is a single sided board or a double sided board and includes a liquid crystal polymer substrate and at least one metal layer. Each of the liquid crystal polymer substrates has a melting point. When a number of the liquid crystal polymer substrates is an odd number equal to or higher than 3, the liquid crystal polymer substrates include a first middle substrate that is located in the most middle position, a first melting point of the first middle substrate is lowest among the melting points of the liquid crystal polymer substrates, and the melting points of the liquid crystal polymer substrates increase in a direction away from the first middle substrate. When the number of the liquid crystal polymer substrates is an even number equal to or higher than 4, the liquid crystal polymer substrates include a second middle substrate and a third middle substrate that are located in the most middle positions, a second melting point of the second middle substrate or a third melting point of the third middle substrate is lowest among the melting points of the liquid crystal polymer substrates, the second melting point and the third melting point are substantially same, and the melting points of the liquid crystal polymer substrates increase in a direction away from the second middle substrate and the third middle substrate.

In some embodiments, the laminates include a first laminate, a second laminate, and a third laminate. The first laminate includes a first liquid crystal polymer substrate and at least one first metal layer, and the first liquid crystal polymer substrate has a fourth melting point. The second laminate includes a second liquid crystal polymer substrate and at least one second metal layer, and the second liquid crystal polymer substrate has a fifth melting point. The third laminate includes a third liquid crystal polymer substrate and at least one third metal layer, and the third liquid crystal polymer substrate has a sixth melting point. The second laminate is disposed between first laminate and the third laminate. The fourth melting point and the sixth melting point are substantially same and higher than the fifth melting point.

In some embodiments, the fourth melting point and the sixth melting point are 33° C. to 57° C. higher than the fifth melting point.

In some embodiments, the multilayer board further includes a fourth laminate and a fifth laminate. The fourth laminate includes a fourth liquid crystal polymer substrate and at least one fourth metal layer, and the fourth liquid crystal polymer substrate has a seventh melting point. The fifth laminate includes a fifth liquid crystal polymer substrate and at least one fifth metal layer, and the fifth liquid crystal polymer substrate has an eighth melting point. The fourth laminate is disposed on the third laminate, and the fifth laminate is disposed under the first laminate. The seventh melting point and the eighth melting point are substantially same, the seventh melting point is higher than the sixth melting point, and the eighth melting point is higher than the fourth melting point.

In some embodiments, the fourth melting point and the sixth melting point are 33° C. to 47° C. higher than the fifth melting point, and the seventh melting point and the eighth melting point are 43° C. to 57° C. higher than the fifth melting point.

In some embodiments, the laminates include a first laminate, a second laminate, a third laminate, and a fourth laminate. The first laminate includes a first liquid crystal polymer substrate and at least one first metal layer, and the first liquid crystal polymer substrate has a fourth melting point. The second laminate includes a second liquid crystal polymer substrate and at least one second metal layer, and the second liquid crystal polymer substrate has a fifth melting point. The third laminate includes a third liquid crystal polymer substrate and at least one third metal layer, and the third liquid crystal polymer substrate has a sixth melting point. The fourth laminate includes a fourth liquid crystal polymer substrate and at least one fourth metal layer, and the fourth liquid crystal polymer substrate has a seventh melting point. The first laminate to the fourth laminate are sequentially stacked from bottom to top. The fifth melting point and the sixth melting point are substantially same, the fourth melting point and the seventh melting point are substantially same, and the fourth melting point and the seventh melting point are higher than the fifth melting point or the sixth melting point.

In some embodiments, the fourth melting point and the seventh melting point are 33° C. to 57° C. higher than the fifth melting point or the sixth melting point.

In some embodiments, the melting point of the liquid crystal polymer substrate that is closest to the first middle substrate is 33° C. to 57° C. higher than the first melting point, and the melting point of the liquid crystal polymer substrate that is closest to the second middle substrate and the third middle substrate is 33° C. to 57° C. higher than the second melting point or the third melting point.

In some embodiments, the liquid crystal polymer substrates include the same liquid crystal polymers.

In some embodiments, the liquid crystal polymer substrates include thermotropic liquid crystal polymers, thermoplastic liquid crystal polymers, or a combination thereof.

The present disclosure provides a method of manufacturing a multilayer board, and the method includes the following operations. A stack is received and includes a plurality of laminates that are stacked from bottom to top. Each of the laminates is a single sided board or a double sided board and includes a liquid crystal polymer substrate and at least one metal layer. Each of the liquid crystal polymer substrates has a melting point. When a number of the liquid crystal polymer substrates is an odd number equal to or higher than 3, the liquid crystal polymer substrates include a first middle substrate that is located in the most middle position, a first melting point of the first middle substrate is lowest among the melting points of the liquid crystal polymer substrates, and the melting points of the liquid crystal polymer substrates increase in a direction away from the first middle substrate. When the number of the liquid crystal polymer substrates is an even number equal to or higher than 4, the liquid crystal polymer substrates include a second middle substrate and a third middle substrate that are located in the most middle positions, a second melting point of the second middle substrate or a third melting point of the third middle substrate is lowest among the melting points of the liquid crystal polymer substrates, the second melting point and the third melting point are substantially same, and the melting points of the liquid crystal polymer substrates increase in a direction away from the second middle substrate and the third middle substrate. The stack is pressed by heat sources placed on a top surface and a bottom surface of the stack, in which the melting point of the liquid crystal polymer substrate closest to the heat sources is $T_m$, and a temperature of the heat sources is $T_m-30°$ C. to $T_m°$ C. The embodiments of the laminates may refer to the aforementioned embodiments.

It is to be understood that the foregoing general description and the following detailed description are merely exemplary and explanatory, and are intended to provide further illustration of the present disclosure.

BRIEF DESCRIPTION OF THE DRAWINGS

The above mentioned or other embodiments, features, and other advantages of the present disclosure can be more clearly understood by referring to the contents of the present disclosure and the additional drawings.

DETAILED DESCRIPTION

Figure 1:
FIG. 1, FIG. 2, FIG. 3, FIG. 5, FIG. 7, FIG. 8, FIG. 9, FIG. 10, and FIG. 12 are schematic diagrams of multilayer boards in accordance with various embodiments of the present disclosure.

The following embodiments of the present disclosure are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

In the present disclosure, it will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

In the present disclosure, a laminate may be a single sided board or a double sided board. The single sided board includes a liquid crystal polymer substrate and a metal layer positioned on the surface of the liquid crystal polymer substrate. The double sided board includes a liquid crystal polymer substrate and two metal layers respectively positioned on the upper surface and the lower surface of the liquid crystal polymer substrate. The metal layer may be an unetched metal foil or a metal circuit formed by etching a metal foil. When the metal layer is the metal circuit, the laminate can also be referred as a circuit board.

The present disclosure provides a multilayer board that includes a plurality of laminates stacked from bottom to top. Each of the laminates is a single sided board or a double sided board. Each of the laminates includes a liquid crystal polymer substrate and at least one metal layer. Each of the liquid crystal polymer substrates has a melting point. A number of laminates is odd number or even number. When the number of the liquid crystal polymer substrates is an odd number equal to or higher than 3, the liquid crystal polymer substrates includes a first middle substrate located in the most middle position, and a first melting point of the first middle substrate is the lowest among the melting points of the liquid crystal polymer substrates, and the melting points of the liquid crystal polymer substrates increase in a direction away from the first middle substrate. In other words, the melting points of the liquid crystal polymer substrates between the first middle substrate and the upper surface of the multilayer board increases from bottom to top, and the melting points of the liquid crystal polymer substrates between the first middle substrate and the bottom surface of the multilayer board increases from top to bottom. When the number of the liquid crystal polymer substrates is an even number equal to or higher than 4, the liquid crystal polymer substrates include a second middle substrate and a third middle substrate located in the most middle positions, the second middle substrate is located on the third middle substrate. A second melting point of the second middle substrate or a third melting point of the third middle substrate is the lowest among the melting points of the liquid crystal polymer substrates. The second melting point and the third melting point are substantially same. The melting points of the liquid crystal polymer substrates increase in a direction away from the second middle substrate and the third middle substrate. In other words, the melting points of the liquid crystal polymer substrates between the second middle substrate and the upper surface of the multilayer board increases from bottom to top, and the melting points of the liquid crystal polymer substrates between the third middle substrate and the bottom surface of the multilayer board increases from top to bottom. In some embodiments, the melting points of the above middle substrates are 283° C. to 287° C., such as 283, 284, 285, 286 or 287° C. In some embodiments, the melting point of the liquid crystal polymer substrate adjacent to the above middle substrate is 33° C. to 57° C. higher than the melting point of the middle substrate, such as 33, 36, 39, 42, 45, 48, 51, 54, or 57° C.

In some embodiments, each of the liquid crystal polymer substrates includes the same kind of liquid crystal polymers. In some embodiments, each of the liquid crystal polymer substrates includes different kinds of liquid crystal polymers. In some embodiments, the liquid crystal polymer substrates include thermotropic liquid crystal polymers, thermoplastic liquid crystal polymers, or a combination thereof.

A manufacturing method of a multilayer board includes hot pressing (e.g., single hot pressing) of a stack containing the above-mentioned laminates. When fabricating the multilayer board, heat sources are placed on the top and bottom surfaces of the stack. In some embodiments, the melting point of the liquid crystal polymer substrate closest to the heat source is $T_m$, and the temperature of the hot pressing is $T_m-30°$ C. to $T_m°$ C. In the stack, the laminates close to the upper and lower surfaces of the stack are heated more, and the laminates farther away from the upper and lower surfaces of the stack are heated less, so the stack is unevenly heated. If the liquid crystal polymer substrates used to carry the metal layers in the laminates all include liquid crystal polymers with the same melting points, the stack may be poorly laminated due to uneven heating. However, the liquid crystal polymer substrates in the laminates of the present disclosure have different melting points, the middlemost liquid crystal polymer substrate has the lowest melting point, the outermost liquid crystal polymer substrates (i.e., the uppermost and the lowermost liquid crystal polymer substrates) have the highest melting point, and the melting points of the remaining liquid crystal polymer substrates increase outward (i.e., upward and downward). Therefore, during the hot pressing process, the deformation degrees of the liquid crystal polymer substrates are similar, so that the multilayer board formed by the stack has the advantages of good flatness and high yield. In addition, liquid crystal polymers have low water absorption, dielectric constant, loss coefficient, thermal expansion coefficient, and excellent dimensional stability, electrical properties, gas barrier properties, and thermal conductivity, so the liquid crystal polymers are more suitable as insulating substrate material for a multilayer board than ordinary dielectric materials.

Various implementation aspects of the multilayer board of the present disclosure will be described below with drawings. The number of laminates in the multilayer board of the present disclosure can be arbitrarily adjusted according to design requirements, such as 3, 4, 5, 6, 7, 8, 9, 10, 11, 12, 13, 14, 15, 16, 17, 18, 19, 20, or 21, but not limited thereto. FIG. 1, FIG. 2, FIG. 3, FIG. 5, FIG. 7, FIG. 8, FIG. 9, FIG. 10, and FIG. 12 are schematic diagrams of multilayer boards in accordance with various embodiments of the present disclosure. FIG. 1, FIG. 2, FIG. 3, FIG. 5, FIG. 7, FIG. 8, FIG. 9, FIG. 10, and FIG. 12 show the implementation aspects of the multilayer boards respectively including 3-layer, 4-layer, 3-layer, 4-layer, 5-layer, 7-layer, 13-layer, 3-layer, or 7-layer laminates.

As shown in FIG. 1, a multilayer board 100 includes 3-layer laminates, i.e., a first laminate 110, a second laminate 120, and a third laminate 130. The number of laminates is not limited to this and can be adjusted arbitrarily. The first laminate 110, the second laminate 120, and the third laminate 130 are each a single sided board or a double sided board. The first laminate 110, the second laminate 120, and the third laminate 130 include a first liquid crystal polymer substrate with a first melting point, a second liquid crystal polymer substrate with a second melting point, and a third liquid crystal polymer substrate with a third melting point, respectively. The second liquid crystal polymer substrate is a middle substrate located in the most middle position. Among all melting points, the second melting point is the lowest, and the first melting point, the second melting point, and the third melting point increase in a direction away from the second liquid crystal polymer substrate. In other words, the first melting point and the third melting point are higher than the second melting point. In some embodiments, the first melting point and the third melting point are substantially same. Since the above-mentioned distribution of the melting points is symmetrical, in the process of forming the multilayer board 100 by hot pressing, the deformation degrees of the first laminate 110 and the third laminate 130 are similar, so that the multilayer board 100 has good flatness and high yield. In some embodiments, the first melting point and the third melting point are 33° C. to 57° C. higher than the second melting point.

Figure 2:
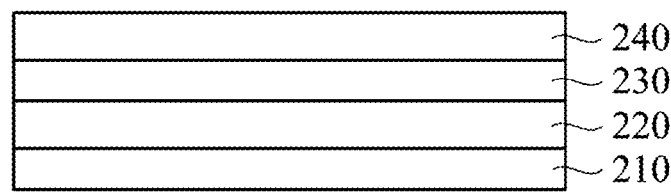

As shown in FIG. 2, a multilayer board 200 includes 4-layer laminates, i.e., a first laminate 210, a second laminate 220, a third laminate 230, and a fourth laminate 240. The number of laminates is not limited to this and can be adjusted arbitrarily. The first laminate 210, the second laminate 220, the third laminate 230, and the fourth laminate 240 are each a single sided board or a double sided board. The first laminate 210, the second laminate 220, the third laminate 230, and the fourth laminate 240 include a first liquid crystal polymer substrate with a first melting point, a second liquid crystal polymer substrate with a second melting point, a third liquid crystal polymer substrate with a third melting point, and a fourth liquid crystal polymer substrate with a fourth melting point, respectively. The second and third liquid crystal polymer substrates are first and second middle substrates located in the most middle positions, respectively. Among all melting points, the second or third melting point is the lowest, and the second and third melting points are substantially same, and the first melting point, the second melting point, the third melting point, and the fourth melting point increase in a direction away from the second and third liquid crystal polymer substrates. In other words, the first and fourth melting points are higher than the second or third melting point. In some embodiments, the first melting point and the fourth melting point are substantially same. Since the above-mentioned distribution of the melting points is symmetrical, in the process of forming the multilayer board 200 by hot pressing, the deformation degrees of the first laminate 210 and the fourth laminate 240 are similar, and the deformation degrees of the second laminate 220 and the third laminate 230 are similar, so that the multilayer board 200 has good flatness and high yield. In some embodiments, the first melting point and the fourth melting point are 33° C. to 57° C. higher than the second melting point or the third melting point.

Figure 3:
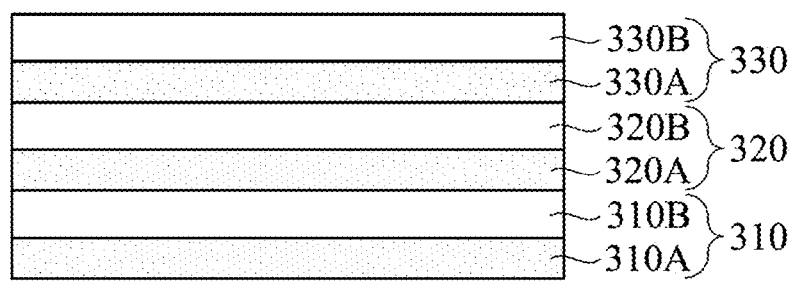

Please refer to FIG. 1 and FIG. 3 at the same time, a multilayer board 300 in FIG. 3 is an embodiment of the multilayer board 100 in FIG. 1. The multilayer board 300 includes three layers of single sided boards, i.e., a first laminate 310, a second laminate 320, and a third laminate 330. The first laminate 310 includes a first liquid crystal polymer substrate 310A with a first melting point and a first metal layer 310B. The second laminate 320 includes a second liquid crystal polymer substrate 320A with a second melting point and a second metal layer 320B. The third laminate 330 includes a third liquid crystal polymer substrate 330A with a third melting point and a third metal layer 330B. The second laminate 320 is disposed between the first laminate 310 and the third laminate 330. The first melting point and the third melting point are higher than the second melting point. In some embodiments, the first melting point and the third melting point are substantially same. In some embodiments, the first melting point and the third melting point are 33° C. to 57° C. higher than the second melting point. In some embodiments, the first metal layer 310B, the second metal layer 320B, and the third metal layer 330B may be unetched metal foils or metal circuits (not shown). Table 1 below lists the multilayer boards 300 of Examples 1-6. In some embodiments, M is 283° C. to 287° C., e.g., 283, 284, 285, 286, or 287° C.

In some embodiments, the high heat-resistant liquid crystal polymer resin includes a liquid crystal polymer resin formed by polymerizing p-hydroxybenzoic acid (HBA), terephthalic acid (TA), and 4,4'-dioxydiphenol (DODP). In other embodiments, the medium heat-resistant liquid crystal polymer resin includes a liquid crystal polymer resin formed by polymerizing p-hydroxybenzoic acid (HBA) and 6-hydroxy-2-naphthoic acid (HNA). In yet another embodiment, the low heat-resistant liquid crystal polymer resin includes a liquid crystal polymer resin formed by polymerizing polyethylene terephthalate (PET) and p-hydroxybenzoic acid (HBA).

In some embodiments, the present disclosure provides a method of adjusting a melting point of a liquid crystal polymer substrate. The liquid crystal polymer substrate includes thermotropic liquid crystal polymer resins. The melting point of the liquid crystal polymer before heating is a melting point $Tm_1$. In some embodiments, the melting point $Tm_1$ is 200° C. to 400° C., such as 250, 270, 280, 290, 300, or 350° C. Step A: The liquid crystal polymer is heated to a first temperature, and the temperature is maintained at the first temperature for a first time. The first temperature is less than or equal to the first melting point of the liquid crystal polymer. In some embodiments, the difference between the first temperature and the melting point $Tm_1$ is

TABLE 1

| | First melting point | Second melting point | Third melting point |
|---|---|---|---|
| Example 1 | M + 33° C. to M + 37° C. | M | M + 33° C. to M + 37° C. |
| Example 2 | M + 43° C. to M + 47° C. | M | M + 43° C. to M + 47° C. |
| Example 3 | M + 53° C. to M + 57° C. | M | M + 53° C. to M + 57° C. |
| Example 4 | M + 43° C. to M + 47° C. | M + 33° C. to M + 37° C. | M + 43° C. to M + 47° C. |
| Example 5 | M + 53° C. to M + 57° C. | M + 33° C. to M + 37° C. | M + 53° C. to M + 57° C. |
| Example 6 | M + 53° C. to M + 57° C. | M + 43° C. to M + 47° C. | M + 53° C. to M + 57° C. |

In some embodiments, each of the thicknesses of the first liquid crystal polymer substrate 310A, the second liquid crystal polymer substrate 320A, and the third liquid crystal polymer substrate 330A is independently 1 um to 2000 um, such as 10 um, 50 um, 100 um, 300 um, 500 um, 700 um, 900 um, 1000 um, 1300 um, or 1500 um, but not limited thereto.

In some embodiments, conductive elements (e.g., conductive vias) (not shown) may be disposed in the first liquid crystal polymer substrate 310A, the second liquid crystal polymer substrate 320A, and the third liquid crystal polymer substrate 330A to electrically connect the metal layers. In some embodiments, the first liquid crystal polymer substrate 310A, the second liquid crystal polymer substrate 320A, and the third liquid crystal polymer substrate 330A each includes different types of liquid crystal polymers. In some embodiments, the first liquid crystal polymer substrate 310A, the second liquid crystal polymer substrate 320A, and the third liquid crystal polymer substrate 330A each includes the same type of liquid crystal polymers. In some embodiments, the first liquid crystal polymer substrate 310A, the second liquid crystal polymer substrate 320A, and the third liquid crystal polymer substrate 330A include thermotropic liquid crystal polymers, and the thermotropic liquid crystal polymers are, for example, thermotropic liquid crystal polymer resins. The thermotropic liquid crystal polymer resins include a first type high heat-resistant liquid crystal polymer resin, a second type medium heat-resistant liquid crystal polymer resin, and a third type low heat-resistant liquid crystal polymer resin.

less than or equal to 100° C., such as 20, 40, 60, or 80° C. In some embodiments, the heating rate is 0.1° C./min to 40° C./min, such as 0.2, 0.5, 1, 5, 10, 20, 30, or 40° C./min. If the heating rate is too slow, the process time may be too long, and the manufacturing cost may be increased. If the heating rate is too fast, the liquid crystal polymer may be unevenly heated. In some embodiments, the first time is 1 minute to 48 hours, such as 1, 5, 20, or 30 minutes or 1, 5, 10, 20, 30, 40, or 48 hours. Step B: The liquid crystal polymer is cooled to a second temperature to form a modified liquid crystal polymer, in which the second temperature is lower than the first temperature. The modified liquid crystal polymer has a melting point $Tm_2$, which is higher than the melting point $Tm_1$ of the liquid crystal polymer. In some embodiments, the second temperature is higher than or equal to a room temperature, such as 30, 40, 50, or 60° C. In some embodiments, the second temperature is less than 100° C. Heating the liquid crystal polymer to the first temperature can partially reorganize its structure. Therefore, when the liquid crystal polymer is cooled to the second temperature, the crystal arrangement, size, and shape of the liquid crystal polymer will change, thus increasing the melting point of the liquid crystal polymer. Steps A and B can be repeatedly performed to increase the melting point of the liquid crystal polymer, and the temperature of each heating is 20° C.-50° C. higher than the temperature of the previous heating. Liquid crystal polymer substrates with different melting points can be fabricated by the above method. The liquid crystal polymer substrates may include the same or different liquid crystal polymers.

In some embodiments, the first liquid crystal polymer substrate 310A, the second liquid crystal polymer substrate 320A, and the third liquid crystal polymer substrate 330A include thermoplastic liquid crystal polymers. In some embodiments, thermoplastic liquid crystal polymers are formed by polymerizing reactants selected from the group consisting of (1) aromatic or aliphatic dicarboxylic acids, (2) aromatic hydroxycarboxylic acids, (3) aromatic or aliphatic dihydroxy compounds, and (4) aromatic diamines, aromatic hydroxylamines, or aromatic amino carboxylic acids.

(1) The aromatic or aliphatic dicarboxylic acids include the group consisting of

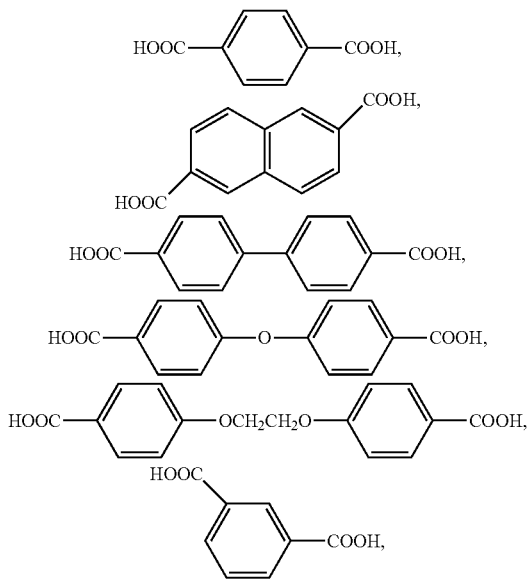

and $HOOC(CH_2)_nCOOH$ (where n is an integer from 2 to 12). (2) The aromatic hydroxycarboxylic acids include the group consisting of

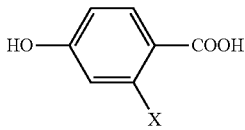

(X may be a hydrogen atom or a halogen atom, a low alkyl group, or a phenyl group),

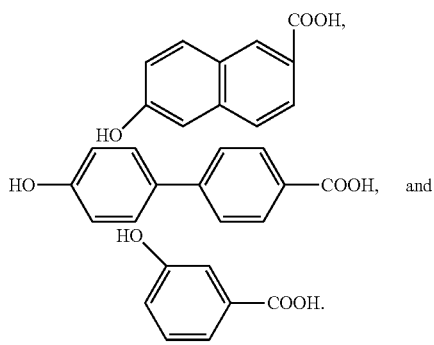

(3) The aromatic or aliphatic dihydroxy compounds include the group consisting of

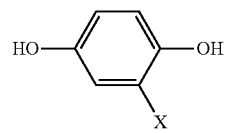

(X may be a hydrogen atom or a halogen atom, a low alkyl, or a phenyl),

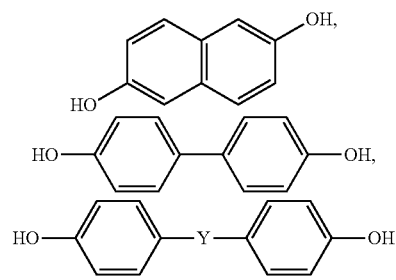

(Y may be O, $CH_2$, or S),

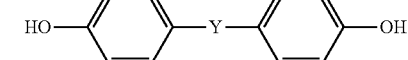

and $HO(CH_2)_nOH$ (n is an integer from 2 to 12). (4) The aromatic diamines, aromatic hydroxylamines, or aromatic amino carboxylic acids include the group consisting of

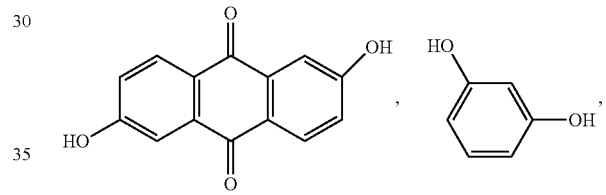

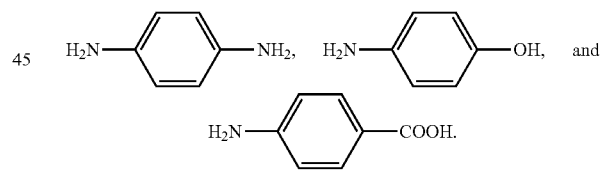

The present disclosure provides a method for adjusting a melting point of a liquid crystal polymer substrate. The liquid crystal polymer substrate includes thermoplastic liquid crystal polymers. The melting point of the liquid crystal polymer substrate before heating is a melting point $Tm_1$. A laminate is heated at a specific temperature, and the heating time is between 1 hour and 24 hours. The specific temperature is higher than or equal to $Tm_1-30°$ C. and less than $Tm_1$, so the melting point of the liquid crystal polymer substrate in the laminate can be increased. In some embodiments, the heating time is 1, 5, 10, 15, 20, or 24 hours. By heating the laminate for a long time, the melting point of the liquid crystal polymer substrate can be raised. As the heating time increases, the melting point of the liquid crystal polymer substrate increases. Liquid crystal polymer substrates with different melting points can be fabricated by the above method. The liquid crystal polymer substrate may include the same or different liquid crystal polymers.

In some embodiments, the first metal layer 310B, the second metal layer 320B, and the third metal layer 330B are each independently a copper substrate, an aluminum substrate, a nickel substrate, a palladium substrate, or a tin substrate, but not limited thereto. For example, the metal layer may be a copper foil. In some embodiments, the thicknesses of the first metal layer 310B, the second metal layer 320B, and the third metal layer 330B are each independently 100 μm to 500 μm, such as 150 μm, 200 μm, 250 μm, 300 μm, 350 μm, 400 μm, or 450 μm, but not limited thereto. In the present disclosure, all the embodiments of the liquid crystal polymer substrates and the metal layers can refer to the above embodiments of FIG. 3.

Figure 4:
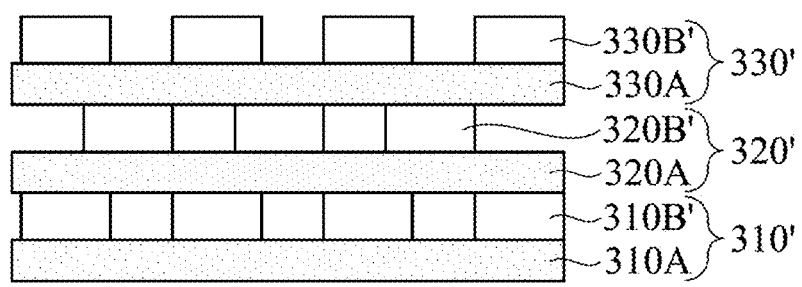
FIG. 4, FIG. 6, and FIG. 11 are schematic diagrams of stacks for forming multilayer boards in accordance with various embodiments of the present disclosure.

Please refer to FIG. 4, which is a schematic diagram of a stack 400 for forming a multilayer board in accordance with various embodiments of the present disclosure. As shown in FIG. 4, before the heat pressing of the stack 400, a first metal layer 310B', a second metal layer 320B', and a third metal layer 330B' of a first laminate 310', a second laminate 320', and a third laminate 330' are patterned metal circuits. These laminates can also be called circuit boards. In some embodiments, after the hot pressing, the first liquid crystal polymer substrate 310A and the second liquid crystal polymer substrate 320A are in direct contact with each other and cover the sidewalls of the first metal layer 310B' (not shown), and the second liquid crystal polymer substrate 320A and the third liquid crystal polymer substrate 330A are in direct contact with each other and cover the sidewalls of the second metal layer 320B' (not shown).

Figure 5:
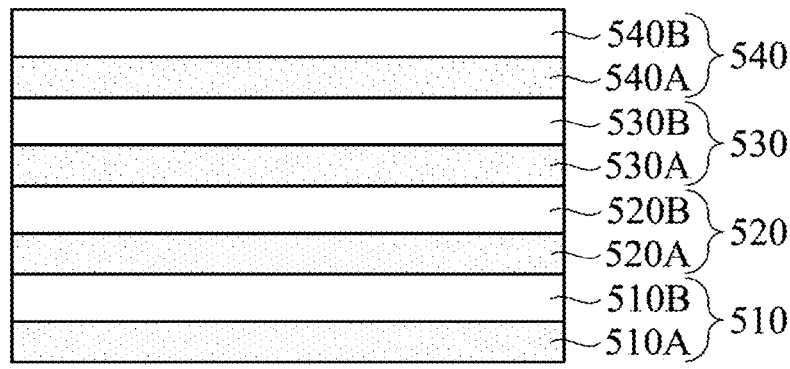

Please refer to FIG. 2 and FIG. 5 at the same time, a multilayer board 500 in FIG. 5 is an embodiment of the multilayer board 200 in FIG. 2. The multilayer board 500 includes four layers of single sided boards. The multilayer board 500 includes a first laminate 510, a second laminate 520, a third laminate 530, and a fourth laminate 540. The first laminate 510 includes a first liquid crystal polymer substrate 510A with a first melting point and a first metal layer 510B. The second laminate 520 includes a second liquid crystal polymer substrate 520A with a second melting point and a second metal layer 520B. The third laminate 530 includes a third liquid crystal polymer substrate 530A with a third melting point and a third metal layer 530B. The fourth laminate 540 includes a fourth liquid crystal polymer substrate 540A with a fourth melting point and a fourth metal layer 540B. The first laminate 510 to the fourth laminate 540 are stacked sequentially from bottom to top. The second melting point is substantially the same as the third melting point, the first melting point is substantially the same as the fourth melting point, and the first melting point and the fourth melting point are higher than the second melting point or the third melting point. In some embodiments, the first melting point and the fourth melting point are 33° C. to 57° C. higher than the second melting point or the third melting point. In some embodiments, the first metal layer 510B, the second metal layer 520B, the third metal layer 530B, and the fourth metal layer 540B may be unetched metal foils or metal circuits (not shown).

Figure 6:
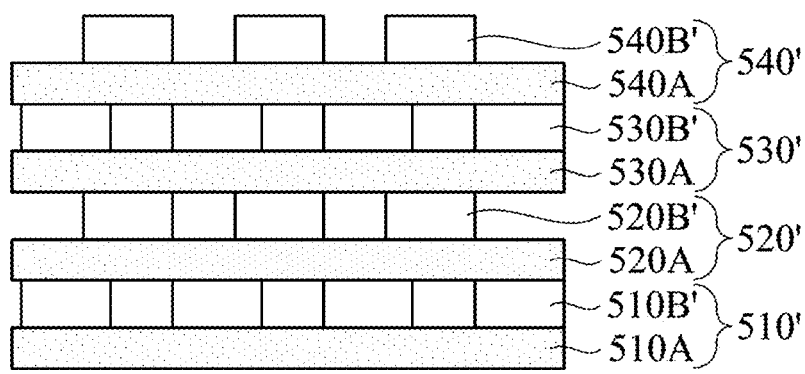

Please refer to FIG. 6, which is a schematic diagram of a stack 600 for forming a multilayer board according to various embodiments of the present disclosure. As shown in FIG. 6, before the heat pressing of the stack 600, a first metal layer 510B', a second metal layer 520B', a third metal layer 530B', and a fourth metal layer 540B' of a first laminate 510', a second laminate 520', a third laminate 530', and a fourth laminate 540' are patterned metal circuits. These laminates can also be called circuit boards. In some embodiments, after the hot pressing, the liquid crystal polymer substrates are in direct contact with each other and cover the sidewalls of the first metal layer 510B', the second metal layer 520B', and the third metal layer 530B' (not shown). The embodiment of the stack 600 after the hot pressing can refer to the embodiment of FIG. 4.

Figure 7:
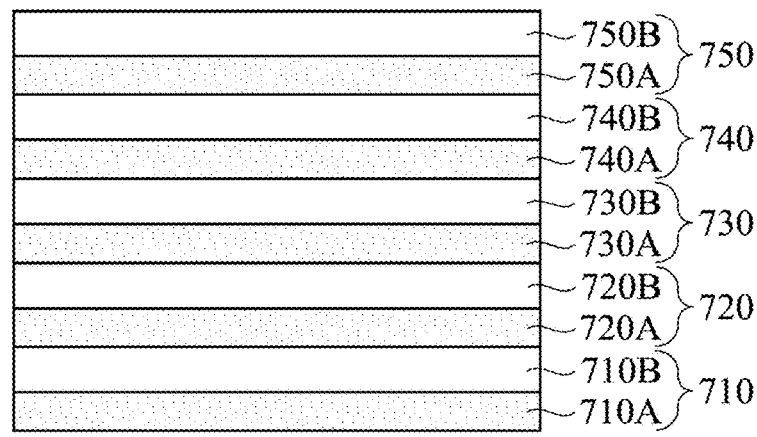

As shown in FIG. 7, a multilayer board 700 includes five layers of single sided boards. The multilayer board 700 includes a first laminate 710, a second laminate 720, a third laminate 730, a fourth laminate 740, and a fifth laminate 750. The first laminate 710 includes a first liquid crystal polymer substrate 710A with a first melting point and a first metal layer 710B. The second laminate 720 includes a second liquid crystal polymer substrate 720A with a second melting point and a second metal layer 720B. The third laminate 730 includes a third liquid crystal polymer substrate 730A with a third melting point and a third metal layer 730B. The fourth laminate 740 includes a fourth liquid crystal polymer substrate 740A with a fourth melting point and a fourth metal layer 740B. The fifth laminate 750 includes a fifth liquid crystal polymer substrate 750A with a fifth melting point and a fifth metal layer 750B. The first laminate 710 to the fifth laminate 750 are stacked sequentially from bottom to top. The third liquid crystal polymer substrate 730A is a middle substrate located in the most middle position. Among all melting points, the third melting point is the lowest, and the first melting point, the second melting point, the third melting point, the fourth melting point, and the fifth melting point increase in a direction away from the third liquid crystal polymer substrate 730A. In other words, the second melting point and the fourth melting point are higher than the third melting point, the first melting point is higher than the second melting point, and the fifth melting point is higher than the fourth melting point. In some embodiments, the second melting point and the fourth melting point are substantially same, and the first melting point and the fifth melting point are substantially same. In some embodiments, the second melting point and the fourth melting point are 33° C. to 47° C. higher than the third melting point, and the first melting point and the fifth melting point are 43° C. to 57° C. higher than the third melting point. Table 2 below lists Embodiments 7-10. In some embodiments, M is 283° C. to 287° C., e.g., 283, 284, 285, 286, or 287° C.

TABLE 2

| | First melting point | Second melting point | Third melting point | Fourth melting point | Fifth melting point |
|---|---|---|---|---|---|
| Example 7 | M + 43° C. to M + 47° C. | M + 33° C. to M + 37° C. | M | M + 33° C. to M + 37° C. | M + 43° C. to M + 47° C. |
| Example 8 | M + 53° C. to M + 57° C. | M + 33° C. to M + 37° C. | M | M + 33° C. to M + 37° C. | M + 53° C. to M + 57° C. |
| Example 9 | M + 53° C. to | M + 43° C. to | M | M + 43° C. to | M + 53° C. to |

TABLE 2-continued

| | First melting point | Second melting point | Third melting point | Fourth melting point | Fifth melting point |
|---|---|---|---|---|---|
| | M + 57° C. | M + 47° C. | | M + 47° C. | M + 57° C. |
| Example 10 | M + 53° C. to M + 57° C. | M + 43° C. to M + 47° C. | M + 33° C. to M + 37° C. | M + 43° C. to M + 47° C. | M + 53° C. to M + 57° C. |

Figure 8:
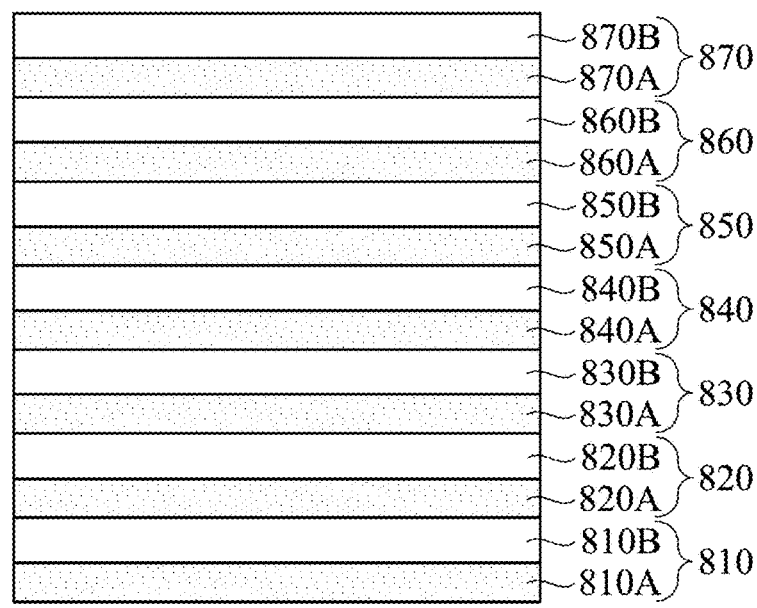

As shown in FIG. 8, a multilayer board 800 includes seven layers of single sided boards. The multilayer board 800 includes first, second, third, fourth, fifth, sixth, and seventh laminates 810, 820, 830, 840, 850, 860, and 870. The above laminates include first, second, third, fourth, fifth, sixth, and seventh liquid crystal polymer substrates 810A, 820A, 830A, 840A, 850A, 860A, 870A and first, second, third, fourth, fifth, sixth, and seventh metal layers 810B, 820B, 830B, 840B, 850B, 860B, 870B. The liquid crystal polymer substrates respectively have first, second, third, fourth, fifth, sixth, and seventh melting points. The first laminate 810 to the seventh laminate 870 are stacked sequentially from bottom to top. The fourth liquid crystal polymer substrate 840A is a middle substrate located in the most middle position. Among all melting points, the fourth melting point is the lowest, and the first melting point, the second melting point, the third melting point, the fourth melting point, the fifth melting point, the sixth melting point, and the seventh melting point increase in a direction away from the fourth liquid crystal polymer substrate 840A. In other words, the third melting point and the fifth melting point are higher than the fourth melting point, the second melting point is higher than the third melting point, the first melting point is higher than the second melting point, the sixth melting point is higher than the fifth melting point, and the seventh melting point is higher than the sixth melting point. In some embodiments, the third melting point and the fifth melting point are substantially same, the second melting point and the sixth melting point are substantially same, and the first melting point and the seventh melting point are substantially same. Table 3 below lists Example 11. In some embodiments, M is 283° C. to 287° C., e.g., 283, 284, 285, 286, or 287° C.

TABLE 3

| | Example 11 |
|---|---|
| First melting point | M + 53° C. to M + 57° C. |
| Second melting point | M + 43° C. to M + 47° C. |
| Third melting point | M + 33° C. to M + 37° C. |
| Fourth melting point | M |
| Fifth melting point | M + 33° C. to M + 37° C. |
| Sixth melting point | M + 43° C. to M + 47° C. |
| Seventh melting point | M + 53° C. to M + 57° C. |

Figure 9:
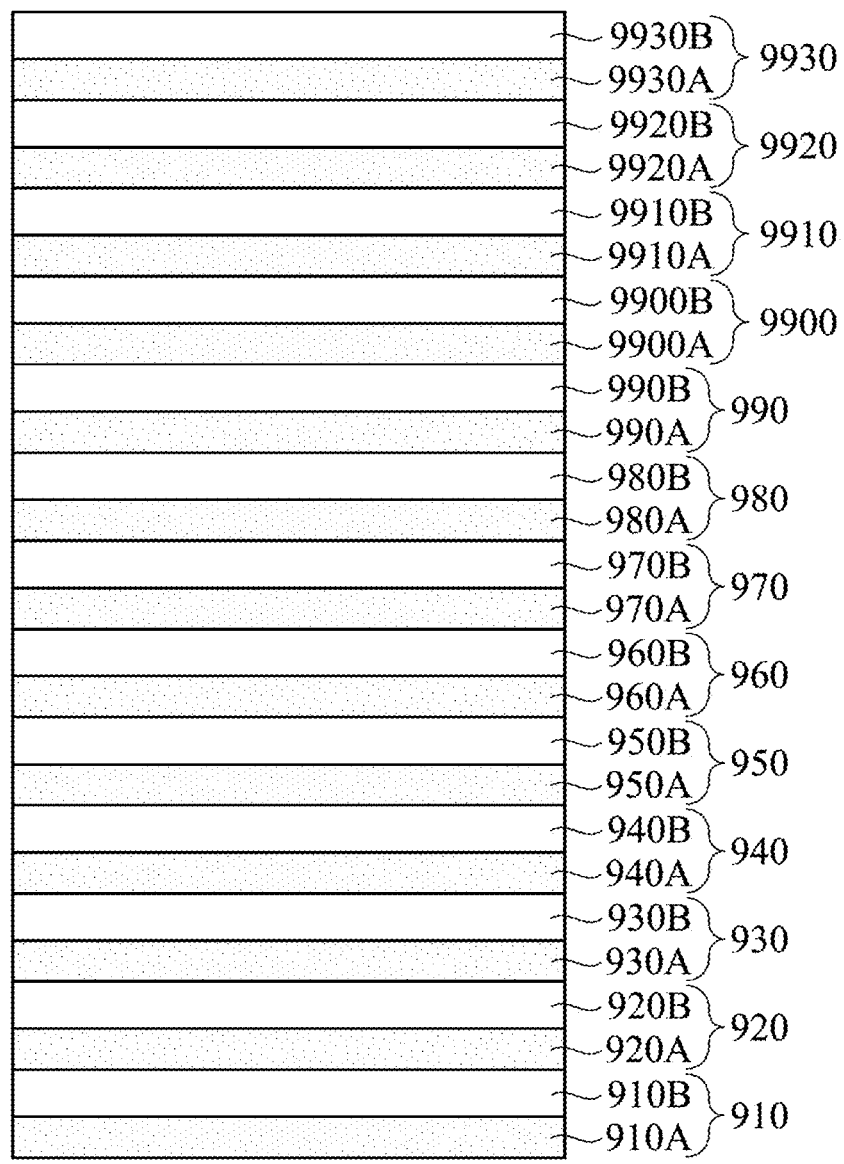

As shown in FIG. 9, a multilayer board 900 includes thirteen layers of single sided boards. The multilayer board 900 includes first, second, third, fourth, fifth, sixth, seventh, eighth, ninth, tenth, eleventh, twelfth, and thirteenth laminates 910, 920, 930, 940, 950, 960, 970, 980, 990, 9900, 9910, 9920, 9930. The above laminates include first, second, third, fourth, fifth, sixth, seventh, eighth, ninth, tenth, eleventh, twelfth, and thirteenth liquid crystal polymer substrates 910A, 920A, 930A, 940A, 950A, 960A, 970A, 980A, 990A, 9900A, 9910A, 9920A, 9930A, and first, second, third, fourth, fifth, sixth, seventh, eighth, ninth, tenth, eleventh, twelfth, and thirteenth metal layers 910B, 920B, 930B, 940B, 950B, 960B, 970B, 980B, 990B, 9900B, 9910B, 9920B, 9930B. The above liquid crystal polymer substrates have first, second, third, fourth, fifth, sixth, seventh, eighth, ninth, tenth, eleventh, twelfth, and thirteenth melting points, respectively. The first laminate 910 to the thirteenth laminate 9930 are stacked sequentially from bottom to top. The seventh liquid crystal polymer substrate 970A is a middle substrate located in the most middle position. Among all melting points, the seventh melting point is the lowest, and all melting points increase in a direction away from the seventh liquid crystal polymer substrate 970A. In detail, the seventh melting point increases toward the thirteenth melting point, and the seventh melting point increases toward the first melting point. Table 4 below lists Example 12. In some embodiments, M is 283° C. to 287° C., e.g., 283, 284, 285, 286, or 287° C.

TABLE 4

| | Example 12 |
|---|---|
| First melting point | M + 53° C. to M + 57° C. |
| Second melting point | M + 53° C. to M + 57° C. |
| Third melting point | M + 43° C. to M + 47° C. |
| Fourth melting point | M + 43° C. to M + 47° C. |
| Fifth melting point | M + 33° C. to M + 37° C. |
| Sixth melting point | M + 33° C. to M + 37° C. |
| Seventh melting point | M |
| Eighth melting point | M + 33° C. to M + 37° C. |
| Ninth melting point | M + 33° C. to M + 37° C. |
| Tenth melting point | M + 43° C. to M + 47° C. |
| Eleventh melting point | M + 43° C. to M + 47° C. |
| Twelfth melting point | M + 53° C. to M + 57° C. |
| Thirteenth melting point | M + 53° C. to M + 57° C. |

Figure 10:
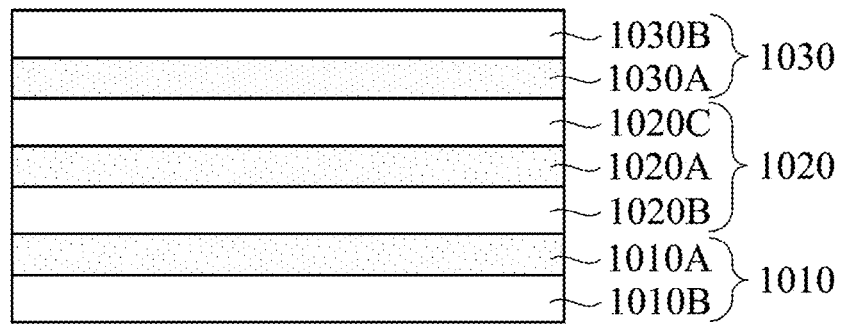

Please refer to FIG. 2 and FIG. 10 at the same time, a multilayer board 1000 of FIG. 10 is an embodiment of the multilayer board 100 of FIG. 1. The multilayer board 1000 includes two layers of single sided boards and one layer of double sided board. The multilayer board 1000 includes a first laminate 1010, a second laminate 1020, and a third laminate 1030. The first laminate 1010 includes a first liquid crystal polymer substrate 1010A with a first melting point and a first metal layer 1010B. The second laminate 1020 includes a second liquid crystal polymer substrate 1020A with a second melting point, a second lower metal layer 1020B, and a second upper metal layer 1020C. The third laminate 1030 includes a third liquid crystal polymer substrate 1030A with a third melting point and a third metal layer 1030B. The second laminate 1020 is disposed between the first laminate 1010 and the third laminate 1030. The first melting point and the third melting point are higher than the second melting point. In some embodiments, the first melting point and the third melting point are substantially same. In some embodiments, the first melting point and the third melting point are 33° C. to 57° C. higher than the second melting point. In some embodiments, the above metal layers may be unetched metal foils or metal circuits (not shown).

Figure 11:
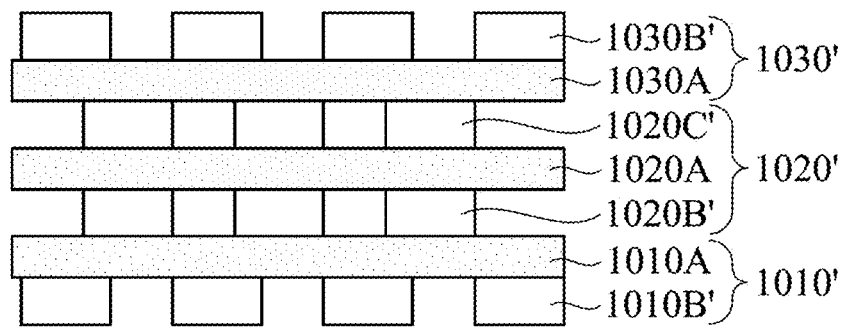

Please refer to FIG. 11, which is a schematic diagram of a stack 1100 for forming a multilayer board according to various embodiments of the present disclosure. As shown in FIG. 11, before hot pressing of the stack 1100, a first metal layer 1010B', a second lower metal layer 1020B', and a second upper metal layer 1020C', and a third metal layer 1030B' of a first laminate 1010', a second laminate 1020', and a third laminate 1030' are patterned metal circuits. These laminates can also be called circuit boards. In some embodiments, after the hot pressing, the liquid crystal polymer substrates are in direct contact with each other and cover the sidewalls of the second lower metal layer 1020B' and the second upper metal layer 1020C' (not shown). The embodiment of the stack 1100 after the hot pressing can refer to the embodiment of FIG. 4.

Figure 12:
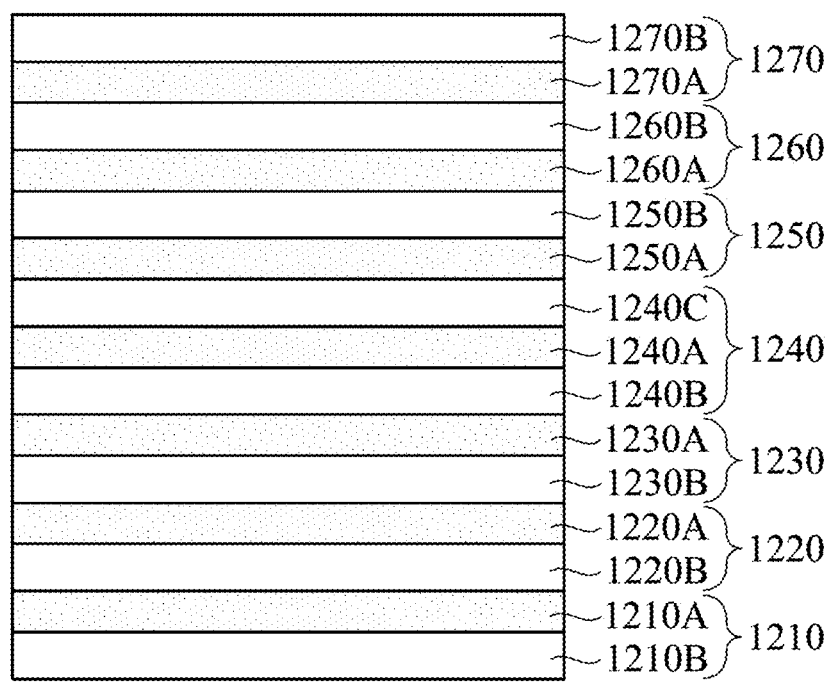

As shown in FIG. 12, a multilayer board 1200 includes six layers of single sided boards and one layer of double sided board. The multilayer board 1200 includes first, second, third, fourth, fifth, sixth, and seventh laminates 1210, 1220, 1230, 1240, 1250, 1260, 1270. The above laminates include first, second, third, fourth, fifth, sixth, and seventh liquid crystal polymer substrates 1210A, 1220A, 1230A, 1240A, 1250A, 1260A, and 1270A. The above laminates also include a first metal layer 1210B, a second metal layer 1220B, a third metal layer 1230B, a fourth lower metal layer 1240B, a fourth upper metal layer 1240C, a fifth metal layer 1250B, a sixth metal layer 1260B, and a seventh metal layer 1270B. The above liquid crystal polymer substrates have first, second, third, fourth, fifth, sixth, and seventh melting points, respectively. The first laminate 1210 to the seventh laminate 1270 are stacked sequentially from bottom to top. The fourth liquid crystal polymer substrate 1240A is a middle substrate located in the most middle position. Among all melting points, the fourth melting point is the lowest, and all melting points increase in a direction away from the four liquid crystal polymer substrate 1240A. In detail, the fourth melting point increases toward the seventh melting point, and the fourth melting point increases toward the first melting point. Table 5 below lists Example 13. In some embodiments, M is 283° C. to 287° C., e.g., 283, 284, 285, 286, or 287° C.

TABLE 5

|  | Example 13 |
| --- | --- |
| First melting point | M + 53° C. to M + 57° C. |
| Second melting point | M + 43° C. to M + 47° C. |
| Third melting point | M + 33° C. to M + 37° C. |
| Fourth melting point | M |
| Fifth melting point | M + 33° C. to M + 37° C. |
| Sixth melting point | M + 43° C. to M + 47° C. |
| Seventh melting point | M + 53° C. to M + 57° C. |

The present disclosure provides a multilayer board that includes multiple laminates. These laminates include multiple layers of liquid crystal polymer substrates with different melting points. The melting point of the middlemost liquid crystal polymer substrate is lowest, the melting points of the outermost liquid crystal polymer substrates are highest, and the melting points of the remaining liquid crystal polymer substrates increase outward. When hot pressing is performed on the above laminates to form a multilayer board, due to the different melting points, the deformation degrees of the liquid crystal polymer substrates are similar, so that the multilayer board has good flatness and high yield. Therefore, the multilayer board has good electrical performance.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A multilayer board, comprising:
a plurality of laminates that are stacked from bottom to top, wherein a number of the laminates is 6, each of the laminates is a single sided board or a double sided board and comprises a liquid crystal polymer substrate and at least one metal layer, each of the liquid crystal polymer substrates has a melting point,
the number of the liquid crystal polymer substrates is 6, the liquid crystal polymer substrates comprise a first middle substrate and a second middle substrate that are located in the most middle position, the first middle substrate is located on the second middle substrate, a first melting point of the first middle substrate or a second melting point of the second middle substrate is lowest among the melting points of the liquid crystal polymer substrates, the first melting point and the second melting point are same, the melting points of the liquid crystal polymer substrates increase in a direction away from the first middle substrate and the second middle substrate, the melting point of the liquid crystal polymer substrate adjacent to the first middle substrate is 33° C. to 57° C. higher than the first melting point of the first middle substrate, and the melting points of the liquid crystal polymer substrates between the first middle substrate and an upper surface of the multilayer board increases from bottom to top.

2. The multilayer board of claim 1, wherein the laminates comprise:
a first laminate comprising a first liquid crystal polymer substrate and at least one first metal layer, wherein the first liquid crystal polymer substrate has a third melting point;
a second laminate comprising a second liquid crystal polymer substrate and at least one second metal layer, wherein the second liquid crystal polymer substrate has a fourth melting point;
a third laminate comprising a third liquid crystal polymer substrate and at least one third metal layer, wherein the third liquid crystal polymer substrate has a fifth melting point; and
a fourth laminate comprising a fourth liquid crystal polymer substrate and at least one fourth metal layer, wherein the fourth liquid crystal polymer substrate has a sixth melting point,
wherein the first laminate, the second laminate, the third laminate, and the fourth laminate are sequentially stacked from bottom to top, the fourth melting point and the fifth melting point are same, the third melting point and the sixth melting point are same, and the third melting point and the sixth melting point are higher than the fourth melting point or the fifth melting point.

3. The multilayer board of claim 2, wherein the third melting point is 33° C. to 57° C. higher than the fourth melting point.

4. The multilayer board of claim 1, wherein the melting point of the liquid crystal polymer substrate that is closest to the second middle substrate is 33° C. to 57° C. higher than the second melting point.

5. The multilayer board of claim 1, wherein the liquid crystal polymer substrates comprise the same liquid crystal polymers.

6. The multilayer board of claim 1, wherein the liquid crystal polymer substrates comprise thermotropic liquid crystal polymers, thermoplastic liquid crystal polymers, or a combination thereof.

7. A method of manufacturing a multilayer board, comprising:
receiving a stack, wherein the stack comprises a plurality of laminates that are stacked from bottom to top, a number of the laminates is 6, each of the laminates is a single sided board or a double sided board and comprises a liquid crystal polymer substrate and at least one metal layer, each of the liquid crystal polymer substrates has a melting point,
the number of the liquid crystal polymer substrates is 6, the liquid crystal polymer substrates comprise a first middle substrate and a second middle substrate that are located in the most middle position, the first middle substrate is located on the second middle substrate, a first melting point of the first middle substrate or a second melting point of the second middle substrate is lowest among the melting points of the liquid crystal polymer substrates, the first melting point and the second melting point are same, the melting points of the liquid crystal polymer substrates increase in a direction away from the first middle substrate and the second middle substrate, the melting point of the liquid crystal polymer substrate adjacent to the first middle substrate is 33° C. to 57° C. higher than the first melting point of the first middle substrate, and the melting points of the liquid crystal polymer substrates between the first middle substrate and an upper surface of the stack increases from bottom to top; and
pressing the stack by heat sources placed on a top surface and a bottom surface of the stack to form the multilayer board, wherein the melting point of the liquid crystal polymer substrate closest to the heat sources is $T_m$, and a temperature of the heat sources is $T_m-30°$ C. to $T_m°$ C.

8. The method of claim 7, wherein the laminates comprise:
a first laminate comprising a first liquid crystal polymer substrate and at least one first metal layer, wherein the first liquid crystal polymer substrate has a third melting point;
a second laminate comprising a second liquid crystal polymer substrate and at least one second metal layer, wherein the second liquid crystal polymer substrate has a fourth melting point;
a third laminate comprising a third liquid crystal polymer substrate and at least one third metal layer, wherein the third liquid crystal polymer substrate has a fifth melting point; and
a fourth laminate comprising a fourth liquid crystal polymer substrate and at least one fourth metal layer, wherein the fourth liquid crystal polymer substrate has a sixth melting point,
wherein the first laminate, the second laminate, the third laminate, and the fourth laminate are sequentially stacked from bottom to top, the fourth melting point and the fifth melting point are same, the third melting point and the sixth melting point are same, and the third melting point and the sixth melting point are higher than the fourth melting point or the fifth melting point.

9. The method of claim 8, wherein the third melting point is 33° C. to 57° C. higher than the fourth melting point.

* * * * *